United States Patent
Zhu

(10) Patent No.: US 9,325,346 B1
(45) Date of Patent: Apr. 26, 2016

(54) SYSTEMS AND METHODS FOR HANDLING PARITY AND FORWARDED ERROR IN BUS WIDTH CONVERSION

(71) Applicant: Marvell International Ltd., Hamilton (BM)

(72) Inventor: Jun Zhu, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 205 days.

(21) Appl. No.: 13/869,503

(22) Filed: Apr. 24, 2013

Related U.S. Application Data

(60) Provisional application No. 61/653,561, filed on May 31, 2012.

(51) Int. Cl.
  *G06F 11/00* (2006.01)
  *H03M 13/05* (2006.01)
(52) U.S. Cl.
  CPC ..................................... *H03M 13/05* (2013.01)
(58) Field of Classification Search
  CPC ... G06F 11/10; G06F 11/1076; H04L 1/0057; H03M 13/116; H03M 13/118
  USPC .......................................................... 714/800
  See application file for complete search history.

(56) References Cited

U.S. PATENT DOCUMENTS

| | | | | |
|---|---|---|---|---|
| 3,266,020 A | * | 8/1966 | Cheney | G06F 9/30072 712/E9.073 |
| 4,809,278 A | * | 2/1989 | Kim | G06F 11/1028 714/805 |
| 6,978,416 B2 | * | 12/2005 | Widmer | H04L 25/4908 714/4.2 |
| 7,165,206 B2 | * | 1/2007 | Lee et al. | 714/763 |
| 2007/0157060 A1 | * | 7/2007 | Ganga et al. | 714/752 |
| 2011/0299555 A1 | * | 12/2011 | Cronie | H04L 1/0057 370/476 |
| 2013/0305127 A1 | * | 11/2013 | Kim et al. | 714/785 |

* cited by examiner

*Primary Examiner* — Albert Decady
*Assistant Examiner* — Enam Ahmed

(57) ABSTRACT

Systems and methods are provided for encoding forwarded error for data bus width conversion. Input data and input forwarded error information are received. System input parity information is computed based on the input data and the input forwarded error information. Output data based on the input data and system output parity information based on the system input parity information are provided, and it is determined whether to indicate a forwarded error output based on the output data and the system output parity information.

18 Claims, 6 Drawing Sheets

US 9,325,346 B1

SYSTEMS AND METHODS FOR HANDLING PARITY AND FORWARDED ERROR IN BUS WIDTH CONVERSION

CROSS-REFERENCE TO RELATED APPLICATION

This application claims the benefit under 35 U.S.C. §119(e) of U.S. Provisional Application No. 61/653,561, filed May 31, 2012, which is hereby incorporated by reference herein in its entirety.

FIELD OF USE

The present disclosure relates generally to converting data widths, and more particularly, to systems and methods for handling parity and forwarded error in bus width conversion.

BACKGROUND OF THE DISCLOSURE

The background description provided herein is for the purpose of generally presenting the context of the disclosure. Work of the inventors hereof, to the extent the work is described in this background section, as well as aspects of the description that may not otherwise qualify as prior art at the time of filing, are neither expressly nor impliedly admitted as prior art against the present disclosure.

Some systems, such as mission critical servers and storage units, require very high reliability. To ensure high reliability, error detection methods (such as parity error and forwarded error) are often used for identifying errors at the interfaces between such systems as well as along internal data paths within the systems.

SUMMARY OF THE DISCLOSURE

In accordance with an embodiment of the disclosure, systems and methods are provided for encoding forwarded error for data bus width conversion. Input data and input forwarded error information are received. System input parity information is computed based on the input data and the input forwarded error information. Output data based on the input data and system output parity information based on the system input parity information are provided, and it is determined whether to indicate a forwarded error output based on the output data and the system output parity information.

The computing comprises determining input parity bits based on the input data and inverting the input parity bits when the input forwarded error information indicates that a decoding error has previously occurred.

The determining whether to indicate a forwarded error output comprises determining output parity bits based on the output data and identifying a mismatch between the output parity bits and the system output parity information. In some implementations, a counter value is incremented based on the identified mismatch and the counter value is compared to a threshold value. An output parity error flag and/or an output forwarded error flag may be based on a comparison between a number of identified mismatches and at least one threshold.

An output forwarded error flag is set to true when a number of mismatches is greater than or equal to a first threshold, and the output forwarded error flag is set to false when the number of mismatches is less than the first threshold.

An output parity error flag is set to true when a number of mismatches is greater than zero and below a second threshold value, and an output parity error flag is set to false when the number of mismatches is zero or greater than or equal to the second threshold value.

The input data is received over a first number of input buses each having a first width, and the output data is provided over a second number of output buses each having a second width different from the first width. The first number multiplied by the first width is equal to the second number multiplied by the second width.

The input data and the system input parity information are stored in a memory unit. Providing the output data comprises reading the stored input data from the memory unit, and providing the system output parity information comprises reading the system input parity information from the memory unit.

BRIEF DESCRIPTION OF THE DRAWINGS

Further features of the disclosure, its nature and various advantages will be apparent upon consideration of the following detailed description, taken in conjunction with the accompanying drawings, in which like reference characters refer to like parts throughout, and in which.

DETAILED DESCRIPTION

To provide an overall understanding of the disclosure, certain illustrative embodiments will now be described. However, the systems and methods described herein may be adapted and modified as is appropriate for the application being addressed and that the systems and methods described herein may be employed in other suitable applications, and that such other additions and modifications will not depart from the scope hereof.

Figure 1:
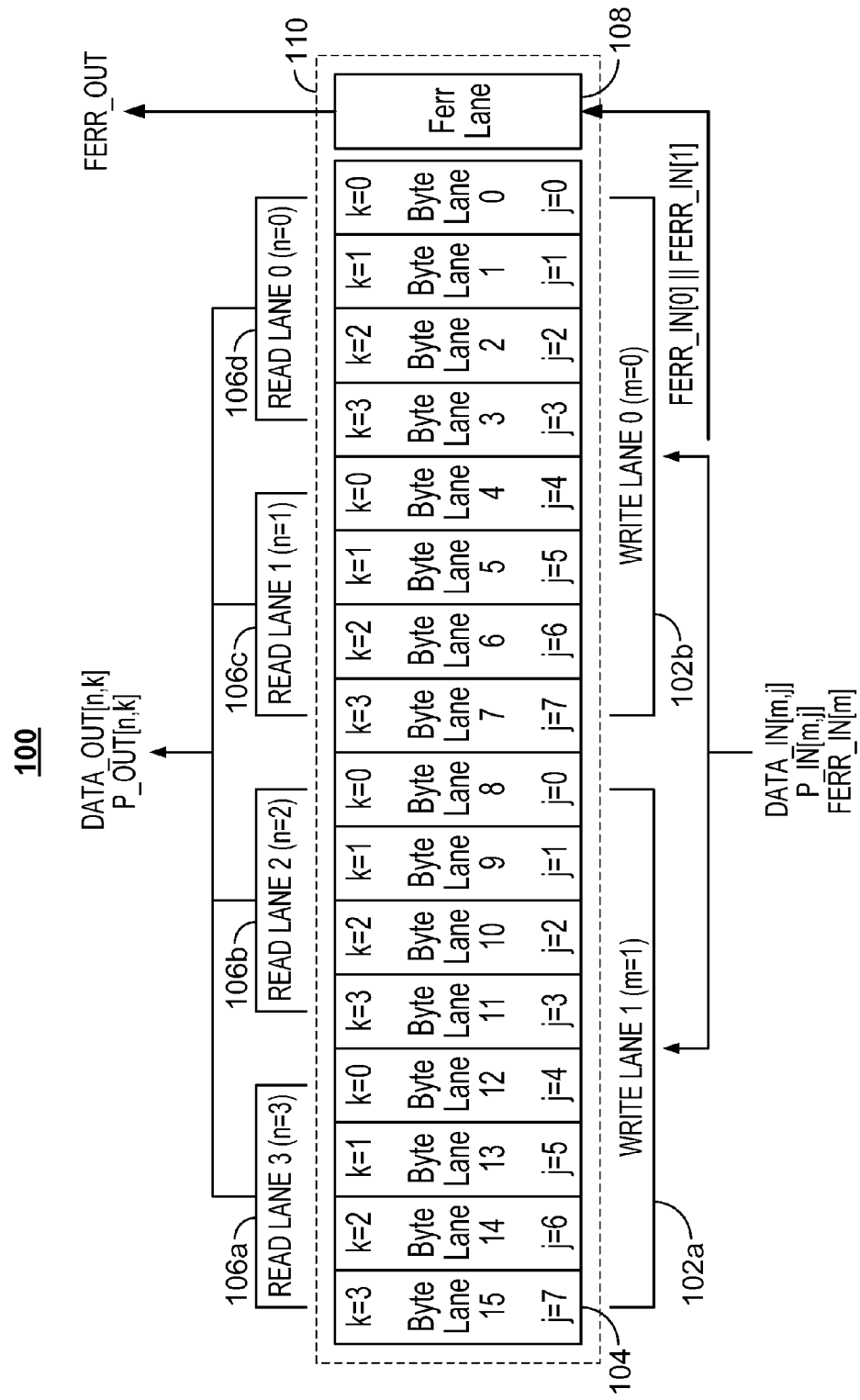
FIG. 1 shows a prior art block diagram of an illustrative bus width conversion system.

FIG. 1 shows a prior art block diagram of an illustrative bus width conversion system 100. System 100 includes two write lanes 102a and 102b (generally, write lane 102), a first in first out (FIFO) system 110, four read lanes 106a-106d (generally, read lane 106). FIFO system 110 includes sixteen byte lanes 104 and a forwarded error lane 108 and may include SRAM for storing data in byte lanes 104 and/or forwarded error lane 108. System 100 provides an interface for enabling communication between two devices that use different bus widths. In particular, each write lane 102 uses a bus width that is eight bytes, or 64 bits, wide. The input data is stored into byte lanes 104 before being output over the read lanes 106, each having a bus width of four bytes, or 16 bits, wide.

Each byte lane may be denoted by a pair of input parameters (m,j), where m denotes the write lane and varies from 0 to 1 and j denotes the byte within the write lane and varies from 0 to 7. In addition, each byte lane may also be denoted by a pair of output parameters (n,k), where n denotes the read lane and varies from 0 to 3 and k denotes the byte lane within the read lane and varies from 0 to 3. Either pair of input parameters or output parameters may fully describe the byte lane 104. In addition, the number of write lanes 102 is denoted M (i.e., as shown in FIG. 1, 2), the width of each write lane 102 is denoted J (i.e., as shown in FIG. 1, 8 bytes), the number of read lanes 106 is denoted N (i.e., as shown in FIG. 1, 4), and the width of each read lane 106 is denoted K (i.e., as shown in FIG. 1, 4 bytes).

FIFO system 110 receives the input data (i.e., DATA_IN (m,j)) over the write lanes 102 and provides the output data (i.e. DATA_OUT(n,k)) over the read lanes 106. To provide error detection during the data transmission from write lanes 102 to read lanes 106, system 100 uses parity bits and forwarded error bits. A parity bit is used to provide error detection for each byte of data and can be an odd parity bit or an even parity bit. Thus, each byte lane 104 may be associated with a parity bit. In this case, each byte lane 104 includes 9 bits of data—8 bits of input data (i.e., denoted by DATA_IN (m,j), where DATA_IN(m,j) is a vector of 8 bits, or one byte of data) and one parity bit based on the 8 bits of input data (i.e., denoted by P_IN(m,j), where P_IN(m,j) is one parity bit). Similarly, the output data includes DATA_OUT(n,k), which denotes a vector of 8 bits, or one byte of data, and output parity data P_OUT(n,k), which denotes one bit of parity data for each byte of output data.

A forwarded error bit indicates whether the data has been corrupted and may be generated and sent on a per-beat-of-data basis. Thus, the parity bits and the forwarded error bit may be associated with different numbers of bits. In particular, one parity bit may be stored for each 8-bit byte lane 104, and one bit of forwarded error may be stored for each write lane 102 (i.e., FERR_IN(m)) or read lane 106 (i.e., FERR_OUT(n)). Thus, for each write lane 102, there are 64 bits of input data (i.e., DATA_IN(m,0:7)), eight bits of parity (i.e., P_IN(m,0:7)), and one bit of forwarded error (i.e., FERR (m)). Furthermore, for each read lane 106, there are 32 bits of output data (i.e., DATA_OUT(n,0:3)), four bits of parity (i.e., P_OUT(n,0:3)), and one bit of forwarded error (i.e., FERR (n)).

Forwarded error lane 108 in FIFO system 110 stores a merged value of the two input forwarded error bits (i.e., FERR_IN(0) and FERR_IN(1)). In particular, the merged value is FERR_IN(0) OR FERR_IN(1), such that if at least one of the input forwarded error bits is one, the stored merged value is one. That is, if any of the data in either write lane is corrupted, the value stored in forwarded error lane 108 is one, indicating that the data is corrupt. In addition, the data in forwarded error lane 108 may be duplicated for further error protection. In an example, the merged value may be duplicated N times, or the number of read lanes 106. In this case, the data stored in forwarded error lane 108 may be compared to its copies, and if there is any mismatch, it may be determined that an error has occurred in forwarded error lane 108.

Figure 2:
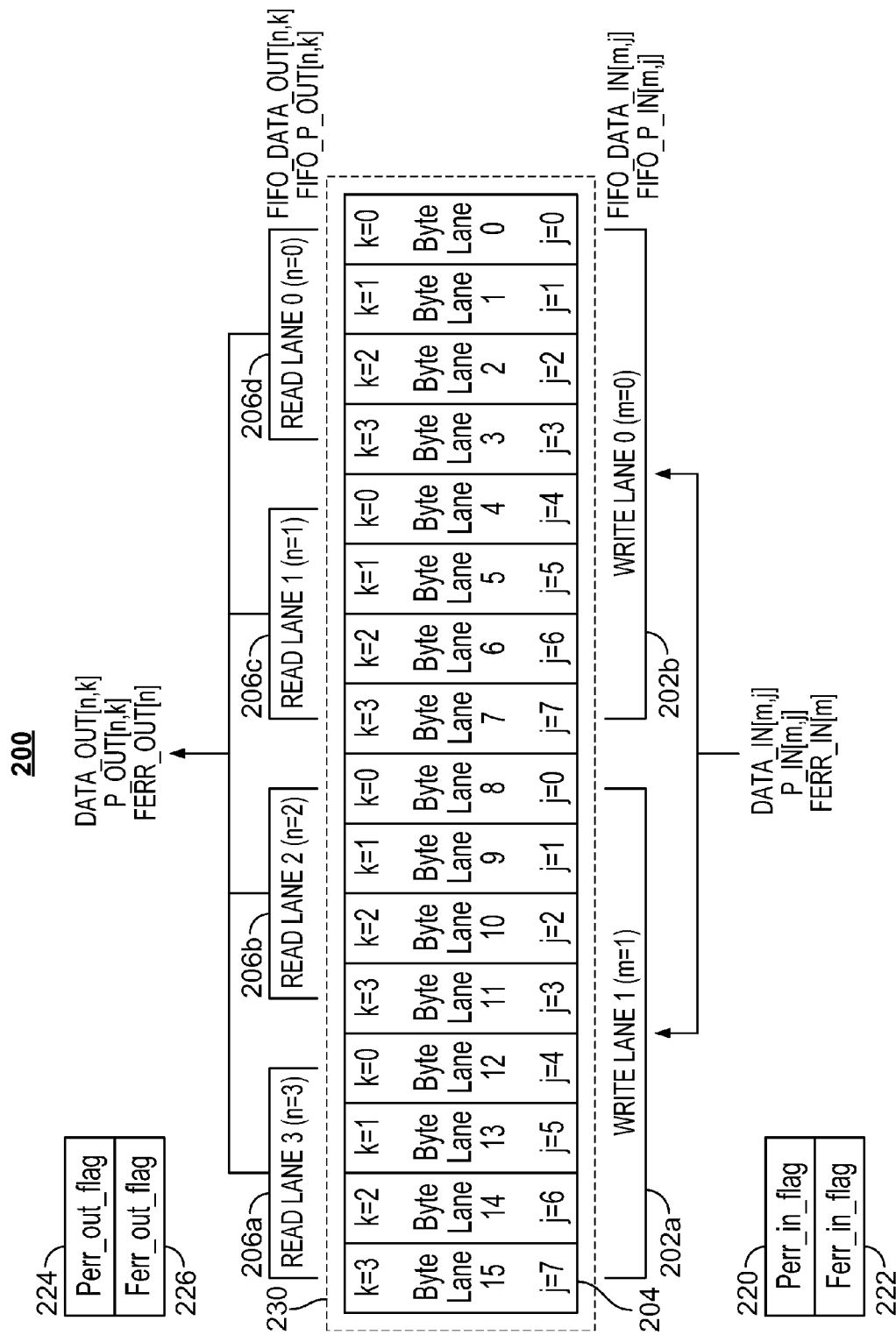
FIG. 2 shows a block diagram of an illustrative bus width conversion system, according to an embodiment of the present disclosure.

FIG. 2 shows a block diagram of an illustrative bus width conversion system 200, in accordance with an embodiment of the disclosure. System 200 includes two write lanes 202a and 202b (generally, write lane 202), a FIFO system 230 including 16 byte lanes 204, four read lanes 206a-206d (generally, read lane 106), and stored flags including an input parity error flag 220, an input forwarded error flag 222, an output parity error flag 224, and an output forwarded error flag 226. System 200 has similar components as system 100, but system 200 does not include a forwarded error lane as in system 100. Instead, system 200 includes storage units 220, 222, 224, and 226 for storing parity error flags and forwarded error flags.

FIFO system 230 may be a middle stage between between an upper stage, which transmits the input data DATA_IN(m, j), and a lower stage, which receives the output data DATA_OUT(n,k). At each stage of the system, the parity bits corresponding to each segment of data (a byte, for example) may be recomputed, such that every time one stage (i.e., a sender) provides data to another stage (i.e., a receiver), the sender ensures that the transmitted parity data is consistent with the sent data. When the receiver receives the data from the sender, the receiver independently computes the parity of the received data. Thus, if a mismatch is identified between the received parity data and the recomputed parity, the origination of the error may be localized to the link between the sender and the receiver devices.

To provide error detection during the data transmission from write lane 202 to read lane 206, system 200 uses parity bits and forwarded error bits. DATA_IN(m,j) denotes a vector of 8 bits, or a byte of input data. A parity bit is used to provide error detection for each byte of data and can be an odd parity bit or an even parity bit. A forwarded error bit indicates whether the data has been corrupted and may be generated and sent on a per-beat-of-data basis. Thus, the parity bits and the forwarded error bit may be associated with different numbers of bits. In particular, one input parity error bit P_IN(m,j) may be stored for each byte of data (i.e., DATA_IN(m,j)) in a byte lane 204. In addition, one input forwarded error bit FERR_IN(m) may be stored for each write lane 202 (i.e., DATA_IN(m,0:7)) including 8 byte lanes 204. Furthermore, one output parity error bit P_OUT(n,k) may be stored for each byte of data (i.e., DATA_OUT(n,k)), and one output forwarded error bit FERR_OUT(n) may be stored for each read lane 206 (i.e., DATA_OUT(n,0:3)).

Flags 220, 222, 224, and 226 are used to store data used for error detection. The flags include two input flags 220 and 222 and two output flags 224 and 226. In some implementations, flags 220, 222, 224, and 226 are "sticky" error flags, meaning that the flags are set to certain values if errors are observed, and cleared only by software command.

In particular, one input parity error flag 220 is stored for each write lane 202. The input parity error flag indicates whether a parity error has occurred in the associated write lane 202. To determine how to set the value for input parity error flag 220, a processor may receive a byte of data (i.e., DATA_IN(m,j)) and process the data to compute an updated parity bit (e.g., P_IN'(m,j)) corresponding to the received byte. The processor then compares the updated parity bit to the received parity bit P_IN(m,j). The processor repeats this process for all the bytes in a write lane 202. If any one or more of the bytes resulted in a mismatch between the updated parity bit and the received parity bit P_IN(m,j), the input parity error flag 220 is set to TRUE. Otherwise, if no mismatches were detected for any of the bytes in the write lane, the input parity error flag 220 is set to FALSE. By determining updated parity bit values and comparing the updated parity bits to the received parity bits, system 200 checks for any inconsistency between the received input data (DATA_IN(m,j)) and the received parity data (P_IN(m,j)). In addition, input forwarded error flag 222 is set to TRUE if the input forwarded error bit FERR_IN(m) indicates that the data is corrupted. Otherwise, input forwarded error flag 222 is set to FALSE.

The processor also generates the system input data (i.e., FIFO_DATA_IN(m,j)) and the system input parity data (i.e., FIFO_P_IN(m,j)) to be written to FIFO system 230. For each byte j in each write lane j, the input data FIFO_DATA_IN(m, j) is set to be equal to the input data DATA_IN(m,j).

The system input parity data FIFO_P_IN(m,j) is determined based on the input data FIFO_DATA_IN(m,j) and the input forwarded error FERR_IN(m). In particular, the parity of the input data FIFO_DATA_IN(m,j) is computed. If the input forwarded error FERR_IN(m) is set to 0, indicating that the input data is not corrupted, then FIFO_P_IN(m,j) is set to the computed parity. However, if the input forwarded error FERR_IN(m) is set to 1, indicating that the input data is corrupted, then FIFO_P_IN(m,j) is set to the inverse of the computed parity. In other words, if the forwarded error input indicates that the input data is corrupted, rather than transmitting the true parity information to FIFO system 230, the inverted version of the true parity information is transmitted to FIFO system 230. This process of setting values for input flags 220 and 222 and determining appropriate data to transmit to FIFO system 230 is described in more detail in relation to FIG. 4.

FIFO system 230 receives input data FIFO_DATA_IN and input parity data FIFO_P_IN and provides output data FIFO_DATA_OUT and output parity data FIFO_P_OUT. Read lanes 206 are used to read the output data and the output parity data from FIFO system 230. A processor may be used to set appropriate values for output parity error flag 224 and output forwarded error flag 226 based on the output data and the output parity data. In particular, for each k byte of data in a read lane 206 (denoted the $n^{th}$ read lane, for example), the processor may calculate an updated output parity bit for the data bits in FIFO_DATA_OUT(n,k). The updated output parity bit may be compared with the system output parity bit FIFO_P_OUT(n,k) to identify, if any, a mismatch. This process may be repeated for each byte of data in a read lane (i.e., for k=0:3). The number of mismatches may be determined and then compared to one or more thresholds. The values for output parity error flag 224 and for output forwarded error flag 226 are selected based on the comparison between the number of mismatches and the one or more thresholds. In particular, when there are four read lanes, the number of mismatches can range from zero to four. In general, the number of mismatches can range from zero to the number of read lanes that are considered.

Referring now to FIG. 2, in an example, if the number of mismatches is zero, this means that each of the four output parity bits was equal to its corresponding updated output parity bit. In this case, it is likely that no error occurred during the reading of the data in read lane 206, and it is also likely that the output data is not corrupted. There is a small possibility that a parity error occurred for each byte and that the data is corrupted. However, this possibility may be so small compared to the likelihood that no parity errors occurred and that the data is not corrupted that it may be negligible. Thus, output parity error flag 224 and output forwarded error flag 226 are both set to FALSE.

In another example, if the number of mismatches is four, this means that a mismatch was identified for each byte in the read lane 206. In this case, identifying a mismatch for each byte indicates either that a parity error occurred in each of the four bytes and that the data is not corrupted, or no parity errors occurred but the data is corrupted. Because the latter scenario is much more likely than the former scenario, output parity error flag 224 is set to FALSE and output forwarded error flag 226 is set to TRUE.

In another example, if the number of mismatches is one or two, this means that one or two mismatches were identified. This indicates either that one or two parity errors occurred and the data is not corrupted, or two or three parity errors occurred and the data is corrupted. Because the former scenario is more likely than the latter scenario, output parity error flag 224 is set to TRUE and output forwarded error flag 226 is set to FALSE.

In another example, if the number of mismatches is three, this indicates either that three parity errors occurred and the data is not corrupted, or one parity error occurred and the data is corrupted. Because the latter scenario is more likely to occur than the former scenario (because one parity error is much more likely than three parity errors), output parity error flag 224 and forwarded error flag 226 are both set to TRUE.

In the above-described examples, the number of mismatches was compared to several different threshold values to determine a likely scenario, and the flags 224 and 226 were set accordingly. In general, one of ordinary skill in the art will understand that any number of thresholds may be used, and the values of the thresholds may depend on a likelihood of observing none, one, two, three, or any number of parity errors, as well as a likelihood of the data being corrupted. This process of determining appropriate values for output flags 224 and 226 is described in more detail in relation to FIG. 5.

System 200 shows a system for converting a wide bus width (i.e., eight bytes) to a narrower bus width (i.e., four bytes). In general, one of ordinary skill in the art will understand that the systems and processes described herein may be used for bus width conversion from any width to any other width, including from narrow bus width to wide bus width. In some implementations, if F_W denotes the width of FIFO system 230, J denotes the width of each write lane 202, and K denotes the width of each read lane 206, F_W may be equal to M×J and F_W may also be equal to N×K, where M and N are independent from each other and are each a power of two. As shown in system 200, F_W is 16 bytes (or 128 bits), J is eight bytes (or 64 bits), M is two write lanes, K is four bytes (or 32 bits), and N is four read lanes.

Figure 3:
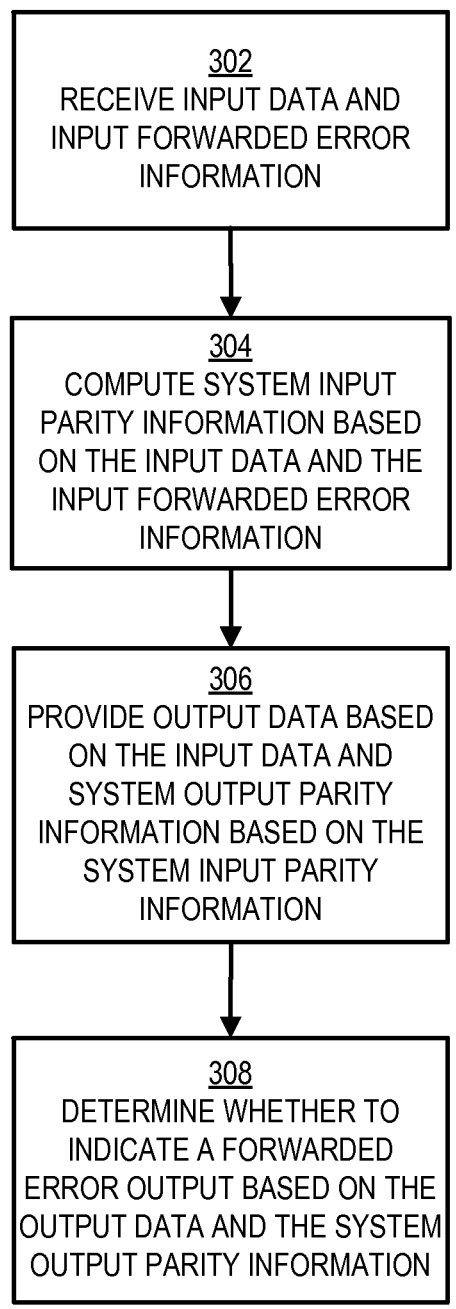
FIG. 3 shows a flow diagram of a process for encoding forwarded error for data bus width conversion, according to an embodiment of the present disclosure.

FIG. 3 shows a flow diagram of a process 300 for encoding forwarded error for data bus width conversion, in accordance with an embodiment of the disclosure. Process 300 includes receiving input data and input forwarded error information (302), computing system input parity information based on the input data and the input forwarded error information (304), providing output data based on the input data and system output parity information based on the system input parity information (304), and determining whether to indicate a forwarded error output based on the output data and the system output parity information (308).

At 302, input data and input forwarded error information are received. The input data (DATA_IN(m,j)) is received over any number of input lanes (16 bytes of data received over two write lanes 202, for example). The input forwarded error information may include one forwarded error bit FERR_IN (m) for each input lane (write lane 202, for example). In addition, parity information may also be received, the parity information including one parity error bit (P_IN(m,j)) for each byte (for each byte in the eight bytes in write lane 202, for example).

A determination may be made regarding whether the forwarded error information in the input data indicates that a decoding error has previously occurred. In particular, the received forwarded error information may include an input forwarded error bit indicating whether the corresponding data is corrupted or not. If corrupted data is detected, input forwarded error flag 222 may be set to indicate the detected corruption. In an example, input forwarded error flag 222 may take on binary values, such that a TRUE value indicates that corrupted data is detected, and FALSE indicates that corrupted data is not detected. In general, input forwarded error flag 222 and any other flag described herein may be a binary value (0 or 1, or yes or no) or may even take on any number of values.

At 304, system input parity information is computed based on the input data and the input forwarded error information. To do this, the input data (DATA_IN(m,j)) received at 302 is used to generate one or more parity error bits. For example, for each byte of data DATA_IN(m,j) in a write lane 202, a parity error bit P_IN'(m,j) is generated. In particular, the system input parity information (e.g., FIFO_P_IN(m,0:J–1) in FIG. 2) for a particular write lane (denoted by m) that is provided to FIFO system 230 is determined based on the parity bits P_IN'(m,0:J–1) and the input forwarded error FERR_IN(m). If input forwarded error is detected (e.g., if FERR_IN(m) is equal to one or if input forwarded error flag 222 is set to TRUE, indicating that the data is corrupted), all the parity bits P_IN'(m,0:J–1) are flipped, or inverted, and the inverted bits are set to the system input parity information FIFO_P_IN(m,0:J–1). Otherwise, if no input forwarded error is detected (e.g., if FERR_IN(m) is equal to zero or if input forwarded error flag 222 is set to FALSE, indicating that the data is not corrupted), none of the parity bits P_IN'(m,0:J–1) are flipped, and the system input parity information FIFO_P_IN(m,0:J–1) is set to P_IN'(m,0:J–1).

The resulting system input parity information FIFO_P_IN (m:0:J–1) is provided to FIFO system 230. Thus, when the forwarded error input indicates that the input data DATA_IN (m,j) is corrupted, rather than transmitting the true parity information P_IN'(m,0:J–1) to FIFO system 230, the inverted version of the true parity information is transmitted to FIFO system 230.

By setting the system input parity information based on the forwarded error data, the system input parity information can indicate whether it is likely that the data has been corrupted. This process of processing the input data provided to FIFO system 230 is described in more detail in relation to FIG. 4. After data is written to byte lanes 204 of FIFO system 230, the data may be provided to read lanes 206, and the output data may be processed.

At 306, output data and system output parity information are provided. The output data FIFO_DATA_OUT(n,k) is determined based on the input data received at 302, and DATA_OUT(n,k) is set to FIFO_DATA_OUT(n,k). The system output parity information FIFO_P_OUT(n,k) is determined based on the system input parity information computed at 304. In an example, FIFO system 230 includes a memory unit, such that the input data DATA_IN(m,j) and the system input parity information FIFO_P_IN(m,j) are provided over one or more write lanes 202 and stored in the memory unit. The output data DATA_OUT(n,k) and the system output parity information FIFO_P_OUT(n,k) are provided over one or more read lanes 206 when the stored data is read out from the memory unit. In particular, the output data is provided when the stored input data is read from the memory unit, and the system output parity information is provided when the stored system input parity information is read from the memory unit. The memory unit may include any memory unit described herein, such as SRAM, DRAM, ROM, flash memory, volatile or non-volatile memory, or any other suitable type of memory.

At 308, it is determined whether to indicate a forwarded error output based on the output data and the system output parity information provided at 306. For example, output parity bits P_OUT(n,K0 are computed based on the output data DATA_OUT(n,k) or FIFO_DATA_OUT(n,k), and compared to the system output parity information FIFO_P_OUT(n,k) that is directly provided by FIFO system 230. The parity bits are compared, and a value for the output forwarded error flag 226 is selected based on the comparison. In particular, if a large number of the output parity bits are mismatched with their corresponding provided output parity bits, it is likely that the data is corrupted. In contrast, if a small number of mismatches are detected, it is likely that the data is not corrupted. An example of a way to process the output data provided by FIFO system 230 is described in more detail in relation to FIG. 5.

Figure 4:
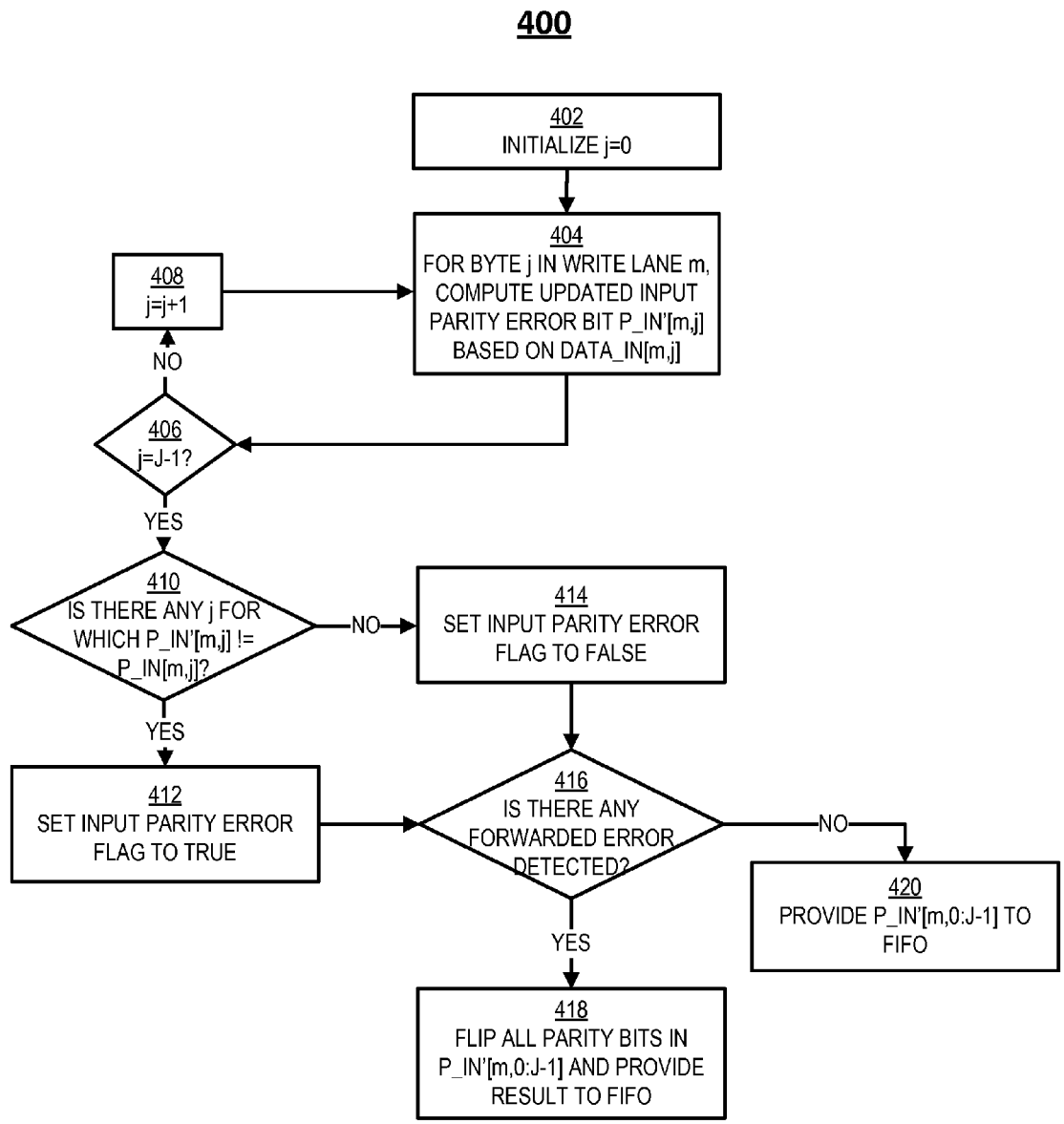
FIG. 4 shows a flow diagram of a process for processing input data in a bus width conversion system, according to an embodiment of the present disclosure.

FIG. 4 shows a flow diagram of a process 400 for processing input data for providing to FIFO system 230, in accordance with an embodiment of the disclosure. In particular, process 400 may be performed by a processor and may be repeated for each write lane 202. Process 400 includes initializing an iteration parameter j to 0 (402) and computing an updated input parity bit P_IN'(m,j) based on the input data DATA_IN(m,j) (404). When 404 is repeated for each byte j in a write lane 202, the processor determines whether there is any byte for which the updated input parity bit P_IN'(m,j) is not equal to the received input parity bit P_IN(m,j) (410). If so, input parity error flag 220 is set to TRUE (412); otherwise, input parity error flag 220 is set to FALSE (414). Furthermore, if any forwarded error is detected (416), the updated parity bits P_IN'(m,j) computed at 404 are flipped and provided to FIFO system 230 (418). Otherwise, if no forwarded error is detected, the updated parity bits P_IN'(m,j) are not modified and are provided to FIFO system 230 (420).

At 402, the iteration parameter j is set to 0. The iteration parameter j corresponds to which byte of data in write lane 202 is currently being processed and, as shown in FIG. 2, varies from 0 to 7. In general, any size of a data segment may be used (e.g., one byte, two bytes, or any other suitable amount of bits of bytes) and any number of data segments (e.g., J=1, 2, 4, 8, or any other suitable number) may be used without departing from the scope of the disclosure.

At 404, the processor computes an updated input parity bit P_IN'(m,j) based on the input data DATA_IN(m,j). In general, because the input data DATA_IN(m,j) is set to be equal to the system input data FIFO_DATA_IN(m,j), it will be understood that whenever DATA_IN(m,j) is referred to herein, that FIFO_DATA_IN(m,j) may be used without departing from the scope of the disclosure, and vice versa. At 406, the iteration parameter j is compared to the number of bytes in a write lane J minus one, and if j is below J–1, the iteration parameter is incremented at 408 and the processor returns to 404 to compute the next updated input parity error bit.

When all bytes in a write lane 202 have been considered, the processor determines whether, for any byte in write lane 202, a mismatch was identified between the updated input parity error bit P_IN'(m,j) and the received input parity error bit P_IN(m,j). If any one or more of the bytes resulted in a mismatch between the updated parity bit and the received parity bit, input parity error flag 220 is set to TRUE at 412, thus indicating that a parity error has occurred for the data in the corresponding write lane. In some implementations, 410 immediately follows 404, such that after each time an updated input parity error bit P_IN'(m,j) is computed, the updated value is compared to the received value P_IN(m,j) to determine if there is a mismatch. Then, upon identifying the first mismatch, the process may proceed to 412 to set the input parity error flag 220 to TRUE.

Otherwise, if no mismatches were detected for any of the bytes in the write lane, the input parity error flag 220 is set to FALSE at 414, thus indicating that no parity error occurred for the data in the corresponding write lane. By determining updated parity bit values and comparing the updated parity bits to the received parity bits, system 200 checks for any inconsistency between the received input data (DATA_IN(m, j)) and the received parity data (P_IN(m,j)).

At 416, the processor determines whether any forwarded error has been detected. In particular, the processor may use the value in FERR_IN(m) to determine whether the data is corrupted. Because FERR_IN(m) is stored as input forwarded error flag 222, the processor may also use the value in flag 222 to determine whether the data in write lane 202 has been corrupted.

The input parity data FIFO_P_IN(m,0:j−1) for a particular write lane (denoted by m) that is provided to FIFO system 230 is determined based on the input data updated parity bits P_IN'(m,0:J−1) and the input forwarded error FERR_IN(m). If forwarded error is detected, all the updated parity bits P_IN'(m,0:J−1) are flipped, or inverted at 418. The result is provided to FIFO system 230. That is, the inverted version of the updated parity bits P_IN'(m,0:J−1) is set to the system input parity information FIFO_P_IN(m,0:J−1). In other words, if the forwarded error input indicates that the input data is corrupted, rather than transmitting the true parity information to FIFO system 230, the inverted version of the true parity information is transmitted to FIFO system 230.

At 420, If the input forwarded error FERR_IN(m) is set to 0, indicating that the input data is not corrupted, then P_IN' (m,0:J−1), or the true updated parity information, is provided to FIFO system 230 as the system input parity information FIFO_P_IN(m,0:J−1).

Figure 5:
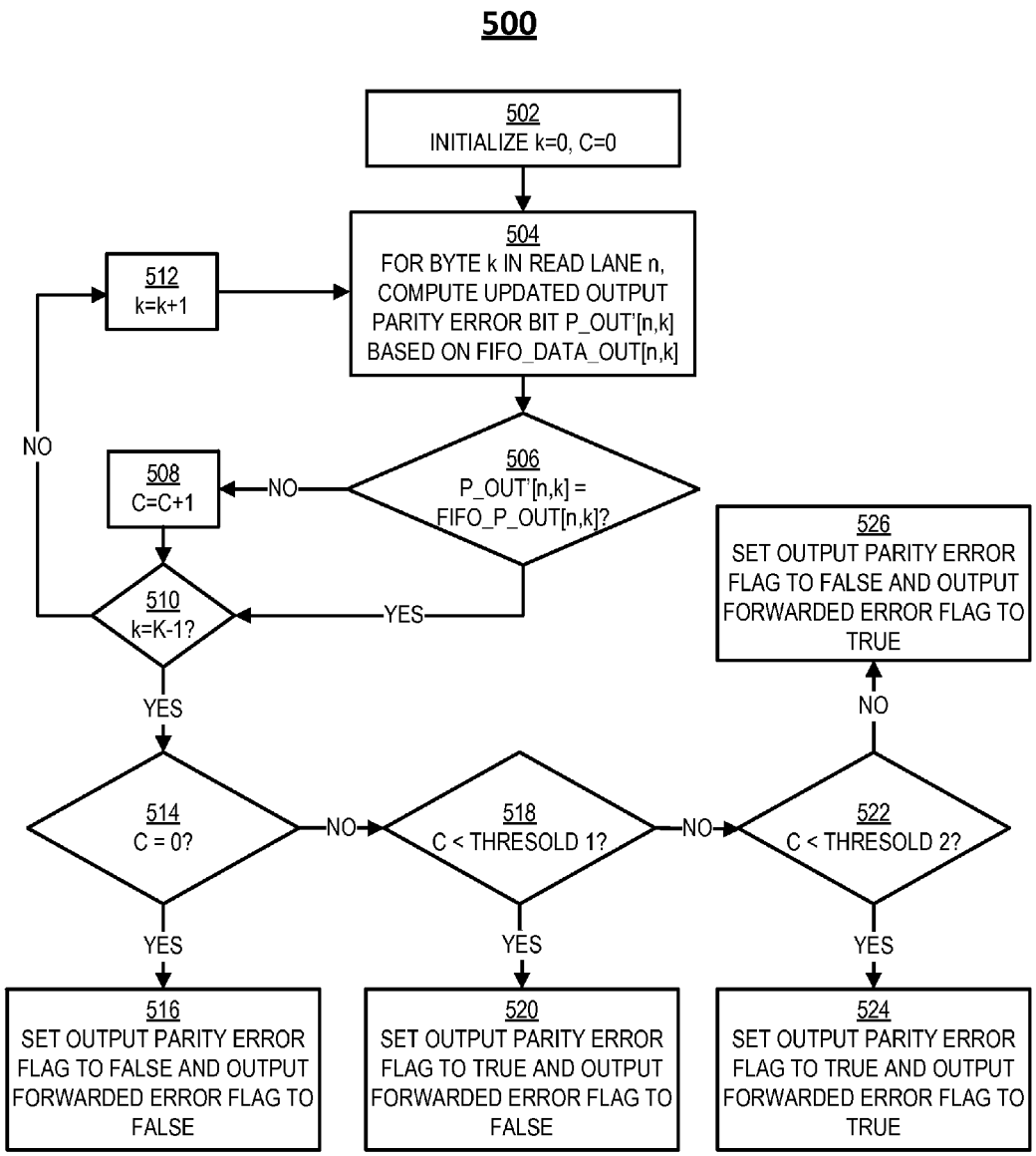
FIG. 5 shows a flow diagram of a process for processing output data in a bus width conversion system, according to an embodiment of the present disclosure.

FIG. 5 shows a flow diagram of a process 500 for processing output data provided by FIFO system 230, in accordance with an embodiment of the disclosure. In particular, process 500 may be executed by a processor and may be repeated for each read lane 206. Process 500 includes, for each byte in a number (i.e., K) of bytes, computing an updated output parity error bit P_OUT'(n,k) (504) and comparing the updated output parity error bit P_OUT'(n,k) to the received output parity error bit P_OUT(n,k) (506). If a mismatch is detected, a counter variable C is incremented (508). After this is repeated for the K bytes in a read lane 206, the value of the counter variable C is compared to a number of predetermined values (514, 518, and 522), and the values for the output parity error flag and the output forwarded error flags are set based on the comparisons (516, 520, 524, and 526).

At 502, the processor initializes an iteration parameter k to zero and the counter variable C to zero. The iteration parameter k indicates which byte (such as which byte lane 204) is currently being processed, and the counter variable C indicates how many parity mismatches are detected.

At 504, the processor computes an updated output parity error bit P_OUT'(n,k). To compute P_OUT'(n,k), the processor computes the parity of a set of system output data, such as a set of eight bits received over read lane 206 (i.e., FIFO_DATA_OUT(n,k) or DATA_OUT(n,k)). In general, because the output data DATA_OUT(n,k) is set to be equal to the system output data FIFO_DATA_OUT(n,k), it will be understood that whenever DATA_OUT(n,k) is referred to herein, that FIFO_DATA_OUT(n,k) may be used without departing from the scope of the disclosure, and vice versa. The parity computation may be based on an odd parity or an even parity, as long as the computation of P_OUT'(n,k) is performed in the same way that P_OUT(n,k) was computed.

At 506, the processor determines whether the updated output parity error bit P_OUT'(n,k) matches the received system output parity information FIFO_P_OUT At 508, if P_OUT'(n,k) does not match FIFO_P_OUT(n, k), the counter variable C is incremented to indicate that a mismatch between the output data and the output parity information has been identified. At 510, the iteration parameter k is compared to the number of bytes K to be processed. In some implementations, the number of bytes K is the number of bytes in an output lane such as read lane 206 (i.e., four).

If the iteration parameter k is less than the number of bytes K minus one, at 512, the iteration parameter k is incremented, and 504, 506, 508, and 510 are repeated until all K bytes in read lane 206 have been considered and processed.

At 514, when all K bytes are processed, the processor determines whether the counter variable C is equal to zero. If C is equal to zero, this means that no mismatches between the updated parity error bits P_OUT'(n,0:K−1) and the received parity error bits FIFO_P_OUT(n,0:K−1) were detected for any of the K bytes. In this case, it is likely that no parity errors occurred, and the data is not corrupted. There is a very small likelihood that parity errors actually occurred in all the K bytes, and the data is corrupted (because the parity error bits would have been flipped in process 400). However, the likelihood that parity errors would occur in each byte and that the data is corrupted is so low that it is instead assumed that no parity errors occurred and that the data is not corrupted. Thus, the output parity error flag 224 is set to FALSE and the output forwarded error flag 226 is set to FALSE at 516.

At 518, the processor determines whether the counter variable C is less than a first threshold value. In some implementations, the first threshold value is a programmable number and may be determined based on a number of write lanes 202 and/or a number of read lanes 206. In an example, the first threshold value is set to be half of the minimum value between the number of bytes in write lane 202 and the number of bytes in read lane 206, plus one. In the example diagram shown in FIG. 2, because there are eight bytes in write lane 202 and four bytes in read lane 206, the first threshold value may be set to three. Thus, if C is less than three, meaning that one or two mismatches have been identified out of the four bytes, the output parity error flag is set to TRUE and the output forwarded error flag is set to FALSE at 520. In this case, at least two scenarios are possible: either one or two parity errors occurred and the data is not corrupted, or two or three parity errors occurred and the data is corrupted. Because the likelihood of having a number of parity errors decreases exponentially as the number increases, the former scenario is more likely than the latter scenario. Thus, it is likely when there is a relatively small number of detected parity mismatches, that a parity error has occurred but that the data is not corrupted.

At 522, the processor determines whether the counter variable C is less than a second threshold value. In some implementations, the second threshold value is set to the number of bytes K. In the example diagram shown in FIG. 2, because there are four bytes in read lane 206, the second threshold value may be set to four. Thus, if C is less than four, meaning that three mismatches have been identified out of the four bytes, the output parity error flag is set to TRUE and the output forwarded error flag is set to TRUE at 520. In this case, again at least two scenarios are possible: either three parity errors occurred and the data is not corrupted, or one parity error occurred and the data is corrupted. Because a small number of parity errors is much more likely to occur than a larger number of parity errors, the latter scenario is more likely to occur than the former scenario. Thus, it is likely that one parity error occurred (thus setting output parity error flag 224 to TRUE) and it is likely that the data is corrupted (thus setting forwarded error flag 226 to TRUE).

Otherwise, if C is equal to or greater than the second threshold value, the output parity error flag is set to FALSE and the output forwarded error flag is set to TRUE at 526. In the example of FIG. 2, this would mean that C is equal to four, meaning that mismatches were identified at all four bytes of the read lane 206. In this case, either a parity error occurred in each of the four byte, or no parity errors occurred but the data is corrupted. Because the latter scenario is much more likely than the former scenario, output parity error flag 224 is set to FALSE and output forwarded error flag 226 is set to TRUE.

As described above, the number of mismatches C was compared to several different threshold values to determine a likely scenario, and the flags 224 and 226 were set accordingly. In general, one of ordinary skill in the art will understand that any threshold may be used, and the values of the thresholds may depend on a likelihood of observing none, one, two, three, or any number of parity errors, as well as a likelihood of the data being corrupted.

Figure 6:
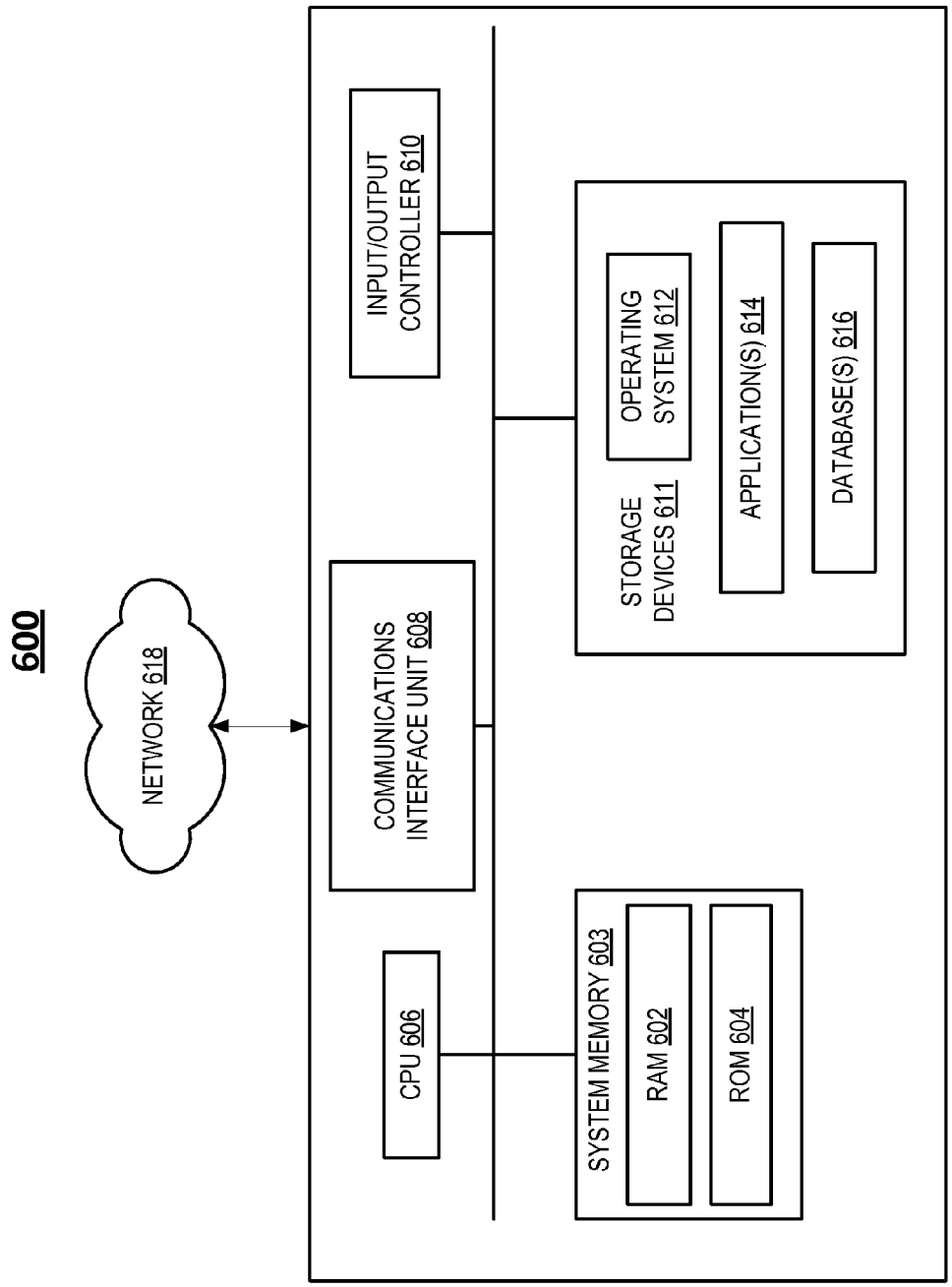
FIG. 6 shows a block diagram of a computing device for performing any of the processes described herein, according to an embodiment of the present disclosure.

FIG. 6 is a block diagram of a computing device for performing any of the processes described herein, in accordance with an embodiment of the disclosure. Each of the components of these systems may be implemented on one or more computing devices 600. In certain aspects, a plurality of the components of these systems may be included within one computing device 600. In certain implementations, a component and a storage device 611 may be implemented across several computing devices 600.

The computing device 600 comprises at least one communications interface unit 608, an input/output controller 610, system memory 603, and one or more data storage devices 611. The system memory 603 includes at least one random access memory (RAM 602) and at least one read-only memory (ROM 604). All of these elements are in communication with a central processing unit (CPU 606) to facilitate the operation of the computing device 600. The computing device 600 may be configured in many different ways. For example, the computing device 600 may be a conventional standalone computer or alternatively, the functions of computing device 600 may be distributed across multiple computer systems and architectures. In FIG. 6, the computing device 600 is linked, via network 618 or local network, to other servers or systems.

The computing device 600 may be configured in a distributed architecture, wherein databases and processors are housed in separate units or locations. Some units perform primary processing functions and contain, at a minimum, a general controller or a processor and a system memory 603. In distributed architecture implementations, each of these units may be attached via the communications interface unit 608 to a communications hub or port (not shown) that serves as a primary communication link with other servers, client or user computers and other related devices. The communications hub or port may have minimal processing capability itself, serving primarily as a communications router. A variety of communications protocols may be part of the system, including, but not limited to: Ethernet, SAP, SAS™, ATP, BLUETOOTH™, GSM and TCP/IP.

The CPU 606 comprises a processor, such as one or more conventional microprocessors and one or more supplementary co-processors such as math co-processors for offloading workload from the CPU 606. The CPU 606 is in communication with the communications interface unit 608 and the input/output controller 610, through which the CPU 606 communicates with other devices such as other servers, user terminals, or devices. The communications interface unit 608 and the input/output controller 610 may include multiple communication channels for simultaneous communication with, for example, other processors, servers or client terminals.

The CPU 606 is also in communication with the data storage device 611. The data storage device 611 may comprise an appropriate combination of magnetic, optical or semiconductor memory, and may include, for example, RAM 602, ROM 604, flash drive, an optical disc such as a compact disc or a hard disk or drive. The CPU 606 and the data storage device 611 each may be, for example, located entirely within a single computer or other computing device; or connected to each other by a communication medium, such as a USB port, serial port cable, a coaxial cable, an Ethernet cable, a telephone line, a radio frequency transceiver or other similar wireless or wired medium or combination of the foregoing. For example, the CPU 606 may be connected to the data storage device 611 via the communications interface unit 608. The CPU 606 may be configured to perform one or more particular processing functions.

The data storage device 611 may store, for example, (i) an operating system 612 for the computing device 600; (ii) one or more applications 614 (e.g., computer program code or a computer program product) adapted to direct the CPU 606 in accordance with the systems and processes described here, and particularly in accordance with the processes described in detail with regard to the CPU 606; or (iii) database(s) 616 adapted to store information that may be utilized to store information required by the program.

The operating system 612 and applications 614 may be stored, for example, in a compressed, an uncompiled and an encrypted format, and may include computer program code. The instructions of the program may be read into a main memory of the processor from a computer-readable medium other than the data storage device 611, such as from the ROM 604 or from the RAM 602. While execution of sequences of instructions in the program causes the CPU 606 to perform the process steps described herein, hard-wired circuitry may be used in place of, or in combination with, software instructions for implementation of the processes of the present disclosure. Thus, the systems and processes described are not limited to any specific combination of hardware and software.

Suitable computer program code may be provided for performing one or more functions in relation to bus width conversion as described herein. The program also may include program elements such as an operating system 612, a database management system and "device drivers" that allow the processor to interface with computer peripheral devices (e.g., a video display, a keyboard, a computer mouse, etc.) via the input/output controller 610.

The term "computer-readable medium" as used herein refers to any non-transitory medium that provides or participates in providing instructions to the processor of the computing device 600 (or any other processor of a device described herein) for execution. Such a medium may take many forms, including, but not limited to, non-volatile media and volatile media. Non-volatile media include, for example, optical, magnetic, or opto-magnetic disks, or integrated circuit memory, such as flash memory. Volatile media include dynamic random access memory (DRAM), which typically constitutes the main memory. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, an EPROM or EEPROM (electronically erasable programmable read-only memory), a FLASH-EEPROM, any other memory chip or cartridge, or any other non-transitory medium from which a computer can read.

Various forms of computer readable media may be involved in carrying one or more sequences of one or more instructions to the CPU 606 (or any other processor of a device described herein) for execution. For example, the instructions may initially be borne on a magnetic disk of a remote computer (not shown). The remote computer can load the instructions into its dynamic memory and send the instructions over an Ethernet connection, cable line, or even telephone line using a modem. A communications device local to a computing device 600 (e.g., a server) can receive the data on the respective communications line and place the data on a system bus for the processor. The system bus carries the data to the main memory, from which the processor retrieves and executes the instructions. The instructions received by the main memory may optionally be stored in memory either before or after execution by the processor. In addition, instructions may be received via a communication port as electrical, electromagnetic or optical signals, which are exemplary forms of wireless communications or data streams that carry various types of information.

The above-described embodiments of the present disclosure are presented for purposes of illustration and not of limitation, and the present disclosure is limited only by the claims which follow.

What is claimed is:

1. A method of encoding forwarded error for data bus width conversion, the method comprising:
    receiving, over a first number of input buses having a first total width, input data and input forwarded error information, wherein a first input bus of the first number of input buses has a first width;
    computing system input parity information based on the input data and the input forwarded error information;
    providing, over a second number of output buses having the first total width, output data based on the input data and system output parity information based on the system input parity information, wherein a first output bus of the second number of output buses has a second width different from the first width;
    determining output parity data based on the output data;
    comparing the output parity data and the system output parity information to determine whether there is an error in the output data; and
    determining whether to indicate a forwarded error output based on the comparing.

2. The method of claim 1, wherein the computing comprises:
    determining input parity bits based on the input data; and
    inverting the input parity bits when the input forwarded error information indicates that a decoding error has previously occurred.

3. The method of claim 1, wherein the determining whether to indicate a forwarded error output further comprises:
    incrementing a counter value based on whether there is an error in the output data; and comparing the counter value to a threshold value.

4. The method of claim 1, further comprising determining an output parity error flag and/or an output forwarded error flag based on a comparison between a number of errors and at least one threshold.

5. The method of claim 1, further comprising:
    setting an output forwarded error flag to true when a number of errors is greater than or equal to a first threshold; and
    setting the output forwarded error flag to false when the number of errors is less than the first threshold.

6. The method of claim 1, further comprising:
    setting an output parity error flag to true when a number of errors is greater than zero and below a second threshold value; and
    setting the output parity error flag to false when the number of errors is zero or greater than or equal to the second threshold value.

7. The method of claim 1, wherein each input bus of the first number of input buses has the first width, and each output bus of the second number of output buses has the second width different from the first width.

8. The method of claim 7, wherein the first total width is the first number multiplied by the first width and is the second number multiplied by the second width.

9. The method of claim 1 further comprising storing the input data and the system input parity information in a memory unit, wherein:
    providing the output data comprises reading the stored input data from the memory unit; and
    providing the system output parity information comprises reading the system input parity information from the memory unit.

10. A system for encoding forwarded error for data bus width conversion, the system comprising a processor configured to:
    receive, over a first number of input buses having a first total width, input data and input forwarded error information, wherein a first input bus of the first number of input buses has a first width;
    compute system input parity information based on the input data and the input forwarded error information;
    provide, over a second number of output buses having the first total width, output data based on the input data and system output parity information based on the system input parity information, wherein a first output bus of the second number of output buses has a second width different from the first width;
    determine output parity data based on the output data;
    compare the output parity data and the system output parity information to determine whether there is an error in the output data; and
    determine whether to indicate a forwarded error output based on the comparing.

11. The system of claim 10, wherein the processor computes the system input parity information by:
    determining input parity bits based on the input data; and
    inverting the input parity bits when the input forwarded error information indicates that a decoding error has previously occurred.

12. The system of claim 10, wherein the processor determines whether to indicate a forwarded error output by:
    incrementing a counter value based on whether there is an error in the output data; and
    comparing the counter value to a threshold value.

13. The system of claim 10, wherein the processor is further configured to determine an output parity error flag and/or an output forwarded error flag based on a comparison between a number of errors and at least one threshold.

14. The system of claim 10, wherein the processor is further configured to:
    set an output forwarded error flag to true when a number of errors is greater than or equal to a first threshold; and
    set the output forwarded error flag to false when the number of errors is less than the first threshold.

15. The system of claim 10, wherein the processor is further configured to:
    set an output parity error flag to true when a number of errors is greater than zero and below a second threshold value; and set the output parity error flag to false when the number of errors is zero or greater than or equal to the second threshold value.

16. The system of claim 10, wherein each input bus of the first number of input buses has the first width; and each output bus of the second number of output buses has the second width different from the first width.

17. The system of claim 16, wherein the first total width is the first number multiplied by the first width and is the second number multiplied by the second width.

18. The system of claim 10, further comprising a memory unit configured to store the input data and the system input parity information, wherein:

the processor provides the output data by reading the stored input data from the memory unit; and the processor provides the system output parity information by reading the system input parity information from the memory unit.

\* \* \* \* \*